United States Patent [19]

Thomas

[11] 4,296,338
[45] Oct. 20, 1981

[54] POWER ON AND LOW VOLTAGE RESET CIRCUIT

[75] Inventor: James S. Thomas, Manor, Tex.

[73] Assignee: Motorola, Inc., Schaumburg, Ill.

[21] Appl. No.: 35,044

[22] Filed: May 1, 1979

[51] Int. Cl.³ .............. H03K 5/153; H03K 5/24; H03K 17/687; H02J 13/00

[52] U.S. Cl. .................. 307/362; 307/594; 307/597; 320/48; 340/636

[58] Field of Search .............. 307/200 A, 200 B, 251, 307/273, 293, 355, 296 A, 304, 362, 363, 364; 320/43, 48; 340/636, 663; 368/10, 66

[56] References Cited

U.S. PATENT DOCUMENTS

| | | | |
|---|---|---|---|
| 3,852,732 | 12/1974 | Yorksie et al. | 340/636 X |
| 3,877,001 | 4/1975 | Bogut et al. | 340/636 X |
| 3,894,247 | 7/1975 | De Jong | 307/293 X |
| 3,895,239 | 7/1975 | Alaspa | 307/279 X |
| 3,950,654 | 4/1976 | Broedner et al. | 307/293 X |
| 4,045,688 | 8/1977 | Stewart | 307/296 A X |
| 4,052,717 | 10/1977 | Arnold et al. | 340/636 X |
| 4,103,187 | 7/1978 | Imamura | 328/48 X |
| 4,163,193 | 7/1979 | Kamiya | 368/66 X |
| 4,219,999 | 9/1980 | Ichikawa et al. | 368/66 |
| 4,224,539 | 9/1980 | Musa et al. | 307/364 X |

FOREIGN PATENT DOCUMENTS 39351 3/1977 Japan ............................. 307/296 A

OTHER PUBLICATIONS

Hanchett, "Turn-On Reset Pulse Circuits"; RCA Technical Notes, TN No. 927, 4 pp., 3/28/73.

Primary Examiner—Larry N. Anagnos
Attorney, Agent, or Firm—Anthony J. Sarli, Jr.; Vincent P. Ingrassia; Jeffrey Van Myers

[57] ABSTRACT

An NMOS power on/low voltage reset circuit provides a substantially instantaneous reset enabling signal when a predetermined fraction of the power supply voltage falls below a predetermined reference voltage. In addition, an external capacitor is discharged. A second reset enabling signal is extended until the capacitor is again charged to a predetermined voltage thus allowing the clock oscillators of a microcomputer sufficient time to stabilize. Self test means are also provided. The reset circuit is implemented on the microcomputer chip.

19 Claims, 2 Drawing Figures

POWER ON AND LOW VOLTAGE RESET CIRCUIT

BACKGROUND OF THE INVENTION

1. Field of the Invention

This invention relates generally to a power failure detector and, more particularly, to a low voltage/power on reset circuit suitable for implementation on a microprocessor chip.

2. Description of the Prior Art

The advantages offered by MOS technology are wellknown; e.g., higher density, greater yield, etc. Thus, smaller MOS device geometries permit a greater number of devices to be produced per unit area or, stated another way, a single MOS device will occupy less space. This characteristic is extremely important in the design and fabrication of complex digital integrated circuits; for example, single chip microprocessors.

Whereas digital circuitry is generally characterized by its "ON/OFF" or "ONE/ZERO" nature, most measurements in the real world are inherently analog; e.g., temperature, pressure, speed, voltage, etc. Therefore, it is necessary that microprocessors and other digital circuitry communicate or interface with analog circuitry such as amplifiers, buffers, comparators, etc., in order to permit digital processing of the analog signals. The required interfacing may be accomplished by providing analog components which are external to microprocessor chip. However, such arrangements generally require more current, a larger power supply and commonly present more opportunities for design and manufacturing errors. To avoid these disadvantages, analog circuits such as differential amplifiers, and comparators are being manufactured integrally with the digital circuitry; e.g., on the microprocessor chip itself, and due to the complex nature of microprocessors, the inclusion of analog devices on the same chip requires that the same manufacturing processes be employed. Thus, for example, low voltage and power-on reset circuits employing a comparator which is to be included on an MOS microprocessor chip must be fabricated in accordance with MOS processing techniques, and the design of the circuit must be tailored to such processing techniques.

As is well-known, microprocessors are comprised of numerous counters, registers and other digital circuitry, and it should be obvious that such circuitry must be initialized to a predetermined state whenever the supply voltage is below some minimum operational value; i.e., as when power is first turned on and during power failures. Such circuitry has generally been implemented external to the microprocessor chip and is comprised of discrete components such as timers and comparators in the power supply line which detect a low voltage condition. In addition to the disadvantages of this type of arrangement described above, such external circuitry greatly increases system cost, and users of microprocessor chips are reluctant to undergo the additional expense resulting from the necessity of supplying this type of external circuitry. Secondly, prior art arrangements generally do not provide a satisfactory reset signal. That is, reset signals should not only set the microprocessor components to a defined state, but should also allow sufficient time for the microprocessor's clock oscillators to stabilize.

SUMMARY OF THE INVENTION

It is an object of the present invention to provide an improved power on reset circuit.

It is a further object of the invention to provide a power on and low voltage reset circuit for use in conjunction with a microcomputer, said circuit being implemented on the microcomputer chip itself.

It is yet another object of the invention to provide an improved power on and low voltage reset circuit which maintains the microcomputer in a reset state for a predetermined length of time after the supply voltage has reached a minimum operating value.

Finally, it an object of the present invention to provide a low voltage and power on reset circuit implemented with N-channel MOS devices.

According to a broad aspect of the invention there is provided an integrated circuit for generating a reset signal when a first voltage falls below a second voltage, said first and second voltages derived from a supply voltage, said integrated circuit having connection means for coupling an external capacitor thereto, comprising: reset signal generating means; first means for generating a first reset enabling signal when said first voltage falls below said second voltage, said first reset enabling signal coupled to an input of said reset signal generating means and terminating when said first voltage exceeds said second voltage; and second means for generating a second reset enabling signal, said second means responsive to said first reset enabling signal and coupled to an input of said reset signal generating means, said second reset enabling signal terminating a predetermined length of time after said first voltage exceeds said second voltage, said predetermined length of time dependent upon the charging time of said capacitor.

According to a further aspect of the invention there is provided an NMOS power on/low voltage reset circuit for providing a reset signal when a predetermined fraction of a supply voltage has a value between first and second predetermined voltages, comprising: first means for generating a reference voltage; second means for comparing said reference voltage with a predetermined fraction of said supply voltage and for generating a first output signal when said predetermined fraction of said supply voltage falls below said reference voltage; third means coupled to said second means and responsive to said first output signal for generating said reset signal; and fourth means coupled to said second means and responsive to said first output signal for extending said reset signal for a predetermined time after said fraction of said supply voltage again exceeds said reference voltage.

The above and other objects, features and advantages of the present invention will be more clearly understood from the following detailed description taken in conjunction with the accompanying drawings, in which:

DESCRIPTION OF THE PREFERRED EMBODIMENT

Figure 1:
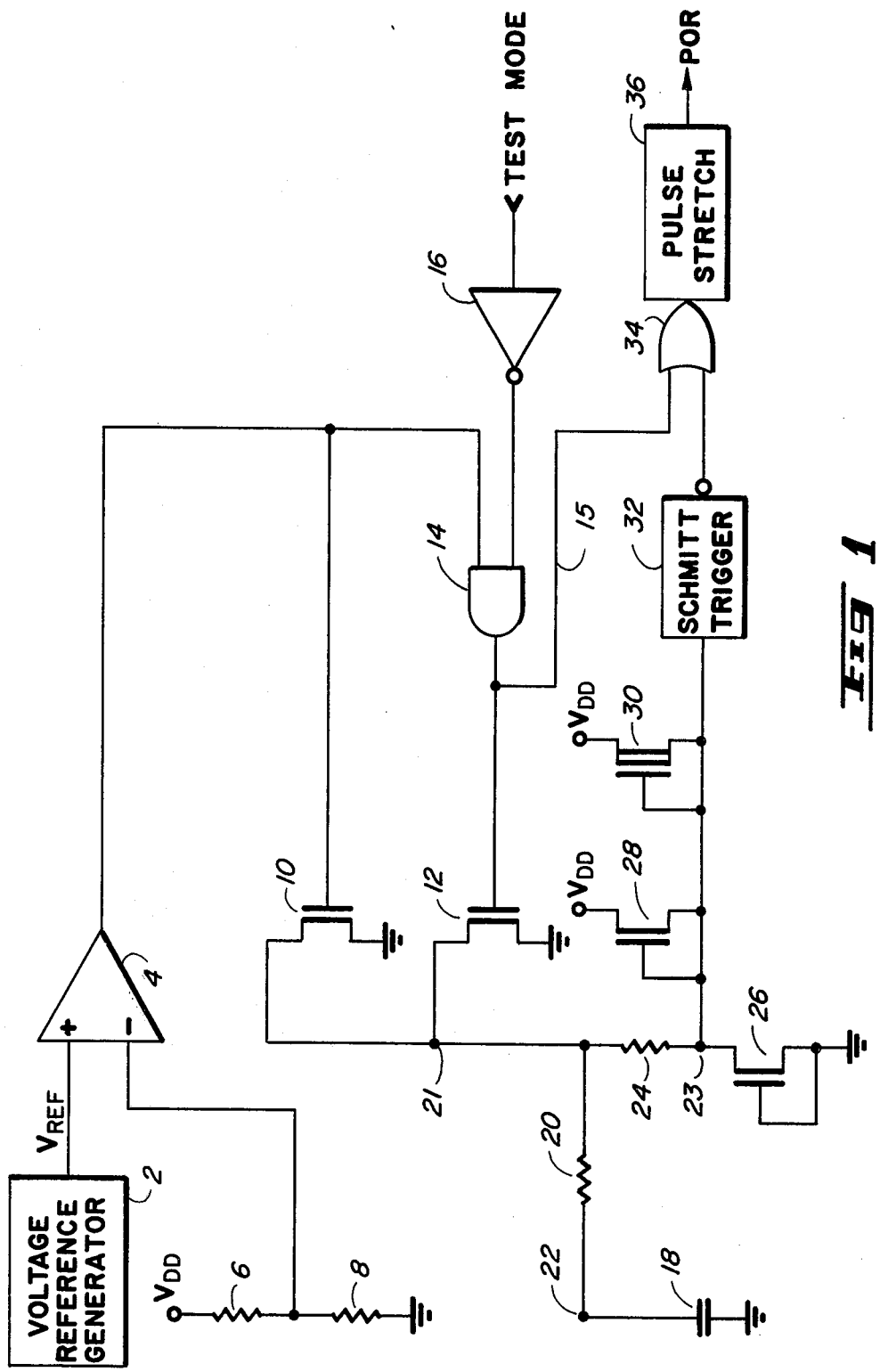
FIG. 1 is a functional block diagram of the inventive power on/low voltage reset circuit.

Referring to FIG. 1, there is shown a voltage reference generator 2 for supplying a reference voltage ($V_{Ref}$) to the positive input of a comParator 4. A voltage divider coupled between the supply voltage $V_{DD}$ and ground and comprised of resistors 6 and 8 produces a second voltage which is applied to the negative input of comparator 4. This voltage is some predetermined fraction of $V_{DD}$. When the voltage established by the voltage divider falls below the reference voltage, comparator 4 will generate an output which is applied to the gate of field effect transistor 10 and to a first input of AND gate 14. A voltage reference generator suitable for use in this circuit is fully described in copending application Ser. No. 939,725 filed Sept. 7, 1978, now U.S. Pat. No. 4,224,539. Furthermore, an MOS circuit suitable for use as comparator 4 is described in detail in U.S. patent application Ser. No. 035,142 filed of even date herewith and entitled "Voltage Detector."

A test mode signal is applied to the input of inverter 16, the output of which is applied to the second input of AND gate 14. The output of AND gate 14 is applied to the gate of field effect transistor 12 and to a first input of OR gate 34. Both field effect transistors 10 and 12 have their source drain paths coupled between a first potential shown as ground in FIG. 1 and node 21. Field effect transistor 10 is geometrically configured so as to perform as a weak discharge device, and field effect transistor 12 is geometrically configured to perform as a strong discharge device. A current limiting resistor 20 is coupled between nodes 21 and 22, and a user supplied capacitor 18 (e.g. 0.47 uf) is coupled between ground and node 22.

An input protection circuit comprised of resistor 24 and field effect transistor 26 configured as a resistor is coupled between nodes 23 and ground. Resistors 20 and 24 may typically have values of 200 and 2 K ohms respectively.

Coupled between the source of supply voltage $V_{DD}$ and node 23 are field effect transistors 28 and 30; preferably, but not necessarily, of an enhancement type and depletion type respectively. In each case, the source and drain electrodes are coupled to node 23. Likewise coupled to node 23 is an input of a Schmitt trigger 32 whose inverted output supplies the second input of OR gate 34. The output of OR gate 34 is coupled to an input of pulse stretcher 36 whose output represents the desired power on/low voltage reset signal (POR).

Assume for the time being that the test mode signal is low, thus enabling AND gate 14 and ignore for now the effect of field effect transistor 10. When power is first turned on, the voltage divider output is lower than the reference voltage until some minimum operating potential shown as level C in FIG. 2 (typically 4.75 volts) is achieved. Level A represents the maximum operating potential (typically 6.5 volts) and level B represents the nominal operating voltage (typically 5.5 volts). The range between levels C and D corresponds to the range of potentials (between 4.25 and 4.75 volts) at which the microprocessor circuits should be reset. Since the divided down supply voltage is lower than the reference voltage, comparator 4 generates an output which passes through AND gate 14 and is applied to the gate of field effect transistor 12 and to the first input of OR gate 34. This direct input path from the output of AND gate 14 to pulse stretcher 36 via OR gate 34 causes the required reset signal to be generated (shown as a low in FIG. 2). Furthermore, since device 12 has been turned on, no charge can be built up across capacitor 18 since there is a direct path to ground via the source and drain electrodes of device 12. At this point, Schmitt trigger 32 is normally off and since its output is inverted, a reset enabling signal is likewise applied to the second input of OR gate 34.

Figure 2:
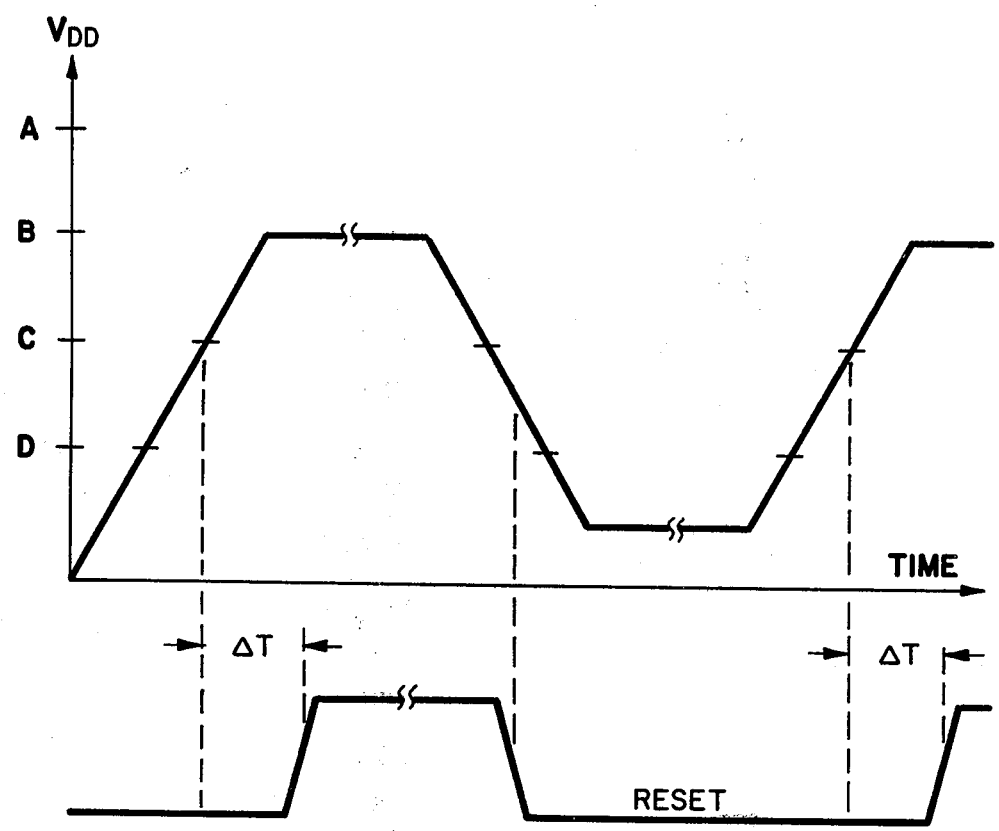
FIG. 2 illustrates in graphical form the reset signal developed by the apparatus shown in FIG. 1 as a function of variations in the supply voltage ($V_{DD}$).

When the supply voltage reaches a minimum operating voltage, the direct reset enabling signal which appeared at the first input of OR gate 34 via line 15 is terminated and field effect transistor 12 is turned off. At this time, the reset signal is still enabled by the second input of OR gate 34 coupled to the inverted output of Schmitt trigger 32. Since device 12 is now turned off, capacitor 18 will begin to be charged by the supply voltage $V_{DD}$ through the current conducting path of depletion device 30. When a sufficient voltage has been built up across capacitor 18, Schmitt trigger 32 will be triggered thus applying a low at the second input of OR gate 34. At this point the output of OR gate 34 is low and the reset signal will be turned off (go high) after the pulse stretching interval. The time it takes for capacitor 18 to charge to a sufficient value to trigger Schmitt trigger 32 is shown in FIG. 2 as $\Delta T$. It is this additional time that permits the clock oscillators to stabilize after a minimum operating voltage has been achieved.

If, after a period of proper performance by the power supply, the power supply voltage again begins to decrease, the output of comparator 4 will again go high when the divided supply voltage has dipped into the reset range defined by levels C and D. Again, an instantaneous reset enable will be applied to OR gate 34 via AND gate 14. Additionally, field effect transistor which, as stated previously, is a strong discharge device, will turn on causing capacitor 18 to discharge. This discharge will again cause Schmitt trigger 32 to go low enabling OR gate 34. Thus, even if the supply voltage should again exceed its minimum operating voltage, the discharging and charging action of capacitor 18 will extend the reset signal. When the supply voltage again attains the proper level, device 12 will be turned off causing capacitor 18 to charge via field effect transistor 30. When the proper voltage appears across capacitor 18, Schmitt trigger 32 will be toggled removing the enabling signal to OR gate 34. Again, the termination of the reset signal has been delayed by a time $\Delta T$ in order to permit the clock oscillators to stabilize.

Up to this point, there appears no necessity for the inclusion of pulse stretcher 36. If, however, the power failure is so brief as to not have any major affect on capacitor 18, the direct reset path (line 15) will cause a momentary reset enabling signal to appear at the first input of OR gate 34. This momentary enabling signal might not be long enough to achieve proper reset of the microcomputer components. In this case pulse stretcher 36 will provide a reset signal of proper duration (e.g. four cycles).

If after a period of normal operation, the supply voltage should instantaneously drop from the minimum operating level to zero, device 12 would not be turned on so as to permit capacitor 18 to discharge. Therefore, clamping device 28 is provided to provide a discharge path for capacitor 18 so as to eventually toggle Schmitt trigger 32 thus generating the required reset enabling signal.

The inventive power on/low voltage reset circuit includes a test feature for determining that voltage at which a reset signal will be generated. Were it not for this feature, inverter 16, AND gate 14 and weak discharge device 10 could be eliminated and the output of comparator 4 coupled directly to the gate of field effect transistor 12 and to the first input of OR gate 34. This test feature operates as follows. To initiate the test, a test mode signal is generated and applied to the input of inverter 16. A zero will be applied from the output of inverter 16 to an input of AND gate 14, thus disabling the output of AND gate 14; i.e. device 12 cannot be turned on and the direct reset cannot be applied to OR gate 34 via line 15. The comparator output is applied to the gate of weak discharge device 10. By monitoring the current at node 22, it can be determined at what voltage device 10 turns on thus indicating voltage at which device 12 would turn on during a normal power on or power failure sequence.

While inventive circuit may be implemented in NMOS, PMOS, CMOS, etc., it is preferably implemented with NMOS devices so that it may be fabricated simultaneously with the fabrication of an NMOS microcomputer and on the same chip. For the sake of completeness, the various device geometries are listed below.

| Item | Width/Length (Microns) |
|---|---|
| 10 | 24/16 |
| 12 | 700/6 |
| 20 | 20/200 |
| 24 | 12/1143 |
| 26 | 72/12 |
| 30 | 10/40 |

The foregoing description is given by way of example only and is not intended to limit the scope of the appended claims. No attempt has been made to illustrate all possible embodiments of the invention rather only to illustrate its principles in the best manner presently known to practice them. Changes in form and detail may occur to one skilled in the art, and it is therefore intended that the invention include all modifications and equivalents which fall within the scope of the appended claims.

I claim:

1. An integrated circuit for generating a reset signal when a first voltage falls below a second voltage, said first and second voltages derived from a supply voltage, said integrated circuit having connection means for coupling an external capacitor thereto, comprising:
    reset signal generating means;
    first means for generating a first reset enabling signal when said first voltage falls below said second voltage, said first reset enabling signal coupled to an input of said reset signal generating means and terminating when said first voltage exceeds said second voltage; and
    second means for generating a second reset enabling signal, said second means responsive to said first reset enabling signal and coupled to an input of said reset signal generating means, said second reset enabling signal terminating a predetermined length of time after said first voltage exceeds said second voltage, said predetermined length of time dependent upon the charging time of said capacitor.

2. A circuit according to claim 1 wherein said first means comprises:
    a comparator for generating an output signal when said first voltage is below said second voltage.

3. A circuit according to claim 2 wherein said second means comprises:
    a first field effect transistor having a gate coupled said first reset enabling signal and a drain coupled to said capacitor for discharging said capacitor at the occurrence of said first reset enabling signal;
    a second field effect transistor having a drain coupled to said supply voltage and having gate and source electrodes coupled to said capacitor for charging said capacitor; and
    trigger means coupled to said capacitor for generating said second reset enabling signal when said capacitor attains a desired voltage.

4. A circuit according to claim 3 wherein said first transistor is an N-channel enhancement type field effect transistor.

5. A circuit according to claim 4 wherein said second transistor is an N-channel depletion type field effect transistor.

6. A circuit according to claim 5 wherein said trigger means is an N-channel MOS Schmitt trigger.

7. A circuit according to claim 5 further including additional means for discharging said capacitor when said first voltage is substantially instantaneously reduced to zero without turning said first transistor on.

8. A circuit according to claim 7 wherein said additional means comprises a third field effect transistor having a drain coupled to said supply voltage and having source and gate electrodes coupled to said capacitor.

9. A circuit according to claim 8 wherein said third field effect transistor is an N-channel enhancement type field effect transistor.

10. A circuit according to claim 3 further including test means for determining the voltage at which said first field effect transistor will turn on.

11. A circuit according to claim 10 wherein said test means comprises:
    means for disabling said reset signal generating means; and
    a third field effect transistor for coupling said capacitor to ground via its source-drain path and having a gate coupled to said first reset enabling signal.

12. A power on/low voltage reset circuit for providing a reset signal when a predetermined fraction of a supply voltage has a value between upper and lower predetermined voltages, said upper voltage lying below a minimum operating voltage, comprising:
    first means for generating a first reset enabling signal when said predetermined fraction of said supply voltage falls within said first and second predetermined voltages, said first reset enabling signal terminating when said predetermined fraction exceeds said upper voltage;
    second means responsive to said first reset enabling signal for generating a second reset enabling signal which terminates a predetermined period of time after said predetermined fraction exceeds said upper voltage; and
    reset signal generating means having a first input coupled to the first means and a second input coupled to the second means, for generating said reset signal in response to either of said first and second reset enabling signals.

13. A circuit according to claim 12 wherein said first means comprises a comparator for generating an output signal when said predetermined fraction is below said upper voltage.

14. A circuit according to claim 13 wherein said second means comprises:
   a first field effect transistor having a gate coupled to said first reset enabling signal and a drain coupled to an external capacitor for discharging said capacitor at the occurrence of said first reset enabling signal;
   a second field effect transistor having a drain coupled to said supply voltage and having gate and source electrodes coupled to said capacitor for charging said capacitor; and
   trigger means coupled to said capacitor for generating said second reset enabling signal when said capacitor attains a desired voltage.

15. A circuit according to claim 14 wherein said first transistor is an N-channel enhancement type field effect transistor and said second field effect transistor is an N-channel depletion type field effect transistor.

16. A circuit according to claim 15 further including additional means for discharging said capacitor when said supply voltage is substantially instantaneously reduced to zero.

17. A circuit according to claim 16 wherein said additional means comprises a third N-channel field effect transistor of the enhancement type having a drain coupled to said supply voltage and having source and gate electrodes coupled to said capacitor.

18. A circuit according to claim 17 further including test means for determining the voltage at which said first field effect transistor turns on, said test means comprising:
   means for disabling said reset signal generating means; and
   a fourth N-channel field effect transistor for coupling said capacitor to ground via its source drain path and having a gate coupled to said first reset enabling signal.

19. An NMOS power on/low voltage reset circuit for providing a reset signal when a predetermined fraction of a supply voltage has a value between first and second predetermined voltages, comprising:
   first means for generating a reference voltage;
   second means for comparing said reference voltage with a predetermined fraction of said supply voltage and for generating a first output signal when said predetermined fraction of said supply voltage falls below said reference voltage;
   third means coupled to said second means and responsive to said first output signal for generating said reset signal; and
   fourth means coupled to said second means and responsive to said first output signal for extending said reset signal for a predetermined time after said fraction of said supply voltage again exceeds said reference voltage.

* * * * *